MINIATURE HIGH POWER MICROWAVE RADIO TRANSMITTER

Filed May 31, 1967

INVENTOR.
Charles B. Wilson

Sept. 30, 1969 C. B. WILSON 3,470,476

MINIATURE HIGH POWER MICROWAVE RADIO TRANSMITTER

Filed May 31, 1967 2 Sheets-Sheet 2

INVENTOR.
Charles B. Wilson

United States Patent Office 3,470,476
Patented Sept. 30, 1969

3,470,476

MINIATURE HIGH POWER MICROWAVE RADIO TRANSMITTER

Charles B. Wilson, Tampa, Fla., assignor to Trak Microwave Corporation, Tampa, Fla.

Filed May 31, 1967, Ser. No. 642,424
Int. Cl. H04b *1/04*
U.S. Cl. 325—120 6 Claims

ABSTRACT OF THE DISCLOSURE

This application discloses a vacuum tube radio transmitter especially adapted for use as an airborne microwave transponder, weighing less than three ounces yet developing a minimum peak power output of 500 watts in grid pulse service at a frequency of 1,090 gHz. The transmitter comprises a grid separation coaxial cavity triode oscillator of very small diameter, less than one inch, in combination with an equally small coaxial cavity triode microwave amplifier. In order to achieve the necessary rise time, pulse length and duty cycle required for efficient and reliable operation in the AIMS air traffic control system for which the transmitter is especially intended, and to limit the frequency spectrum of radiated energy to the required narrow band, the cathode of the amplifier is isolated from ground potential, and a fixed inductance is added internally. To dissipate the substantial heat developed by the generation of so much radio frequency power, the entire transmitter is cradled in intimate contact with conforming internal surfaces of a die-cast aluminum enclosure. The cast metallic enclosure in addition to serving as an efficient heat sink also provides radio frequency shielding to effectively prevent the radiation of stray signals.

BACKGROUND OF THE INVENTION

The problem to which the invention is directed is the provision of a compact, lightweight, highly efficient radio transmitter as an airborne transponder capable of a minimum power output of five hundred watts in pulse coded operation at 1,090 gHz., and with maximum side lobe suppression to prevent signal splash over into adjacent frequency bands which are assigned to other services. In order to prevent interference on adjacent bands it has been necessary to provide a relatively slow rise and fall in pulse power, of the order of 50 nanoseconds, and still achieve a duration of 500 nanoseconds for the peak pulse power centered at the alloted frequency. This is achieved, in part, by the introduction of tuned inductance into the internal cathode line of a coaxial microwave amplifier. In order to achieve the minimum size possible for such a transmitter, a grid separation circuit is employed for the microwave oscillator which is operated in the quarter-wave mode. In order to obtain the required high power output in a minimum of space, and with minimum weight, a similar coaxial structure is employed as a power amplifier with internal provisions for accommodating 1,000 volts direct current plate power at 2.3 amperes peak current, and to dissipate the heat generated by the production of so much radio frequency energy the entire combination of oscillator and amplifier is cradled in a cast aluminum container which functions both as a heat sink and an electrostatic and electromagnetic shield. The transmitter chain of the invention is capable of continuous operation for more than 2,500 hours, at a constant .01 duty, without any perceptible change in power output or frequency. Furthermore, frequency stability vs. temperature, VSWR, and change in anode heater voltage must be maintained within ±3 mHz. Thus, the features of all of this individual elements cooperate together, in combination, to produce the unitary results called for by these stringent requirements for AIMS air traffic control transponder.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

DETAILED DESCRIPTION

Figure 1:
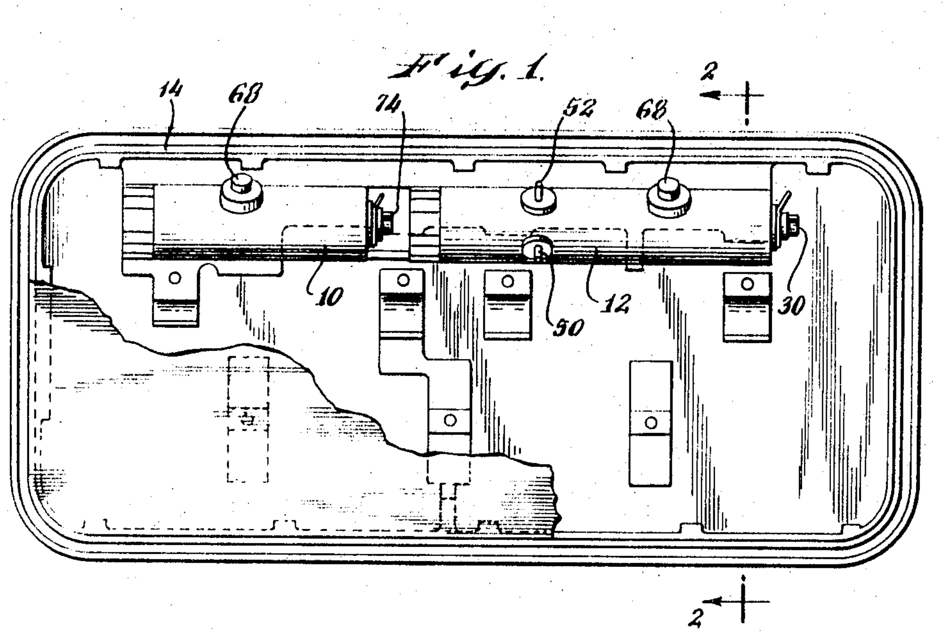
FIGURE 1 is a reduced scale plan view of the cast aluminum enclose, with the cover removed to show the oscillator and amplifier elements of the invention installed in place.
Figure 2:
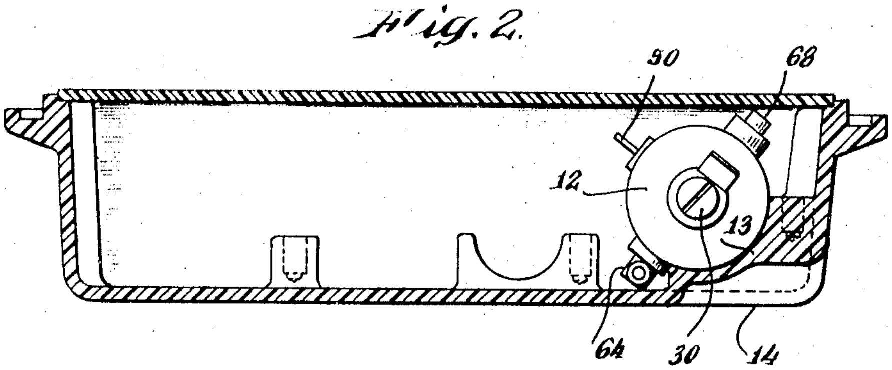
FIGURE 2 is an enlarged sectional view taken along the line 2—2 of FIGURE 1.

Referring now in greater detail to FIGURE 1 of the drawings, the radio transmitter of the invention is seen to comprise a substantially cylindrical oscillator unit 10 connected with a cylindrical power amplifier unit 12, both mounted in contour conforming cradles within a cast metallic enclosure 14. The casing enclosure 14 is preferably formed of cast aluminum for minium weight, while the transmitter units are machined from polished brass and preferably plated with silver and/or gold to reduce skin effect losses of the microwave energy produced therein. The enclosure 14 also contains radio receiver components and coupling elements (not shown) which complete the microwave transponder but do not form part of the herein claimed invention. FIGURE 2 shows in greater detail the manner in which the power amplifier 12 is fitted into the casing enclosure 14 with its cylindrical surface in intimate contact with a mating surface 13 cast into the container 14, for maximum heat dissipation.

Figure 3:
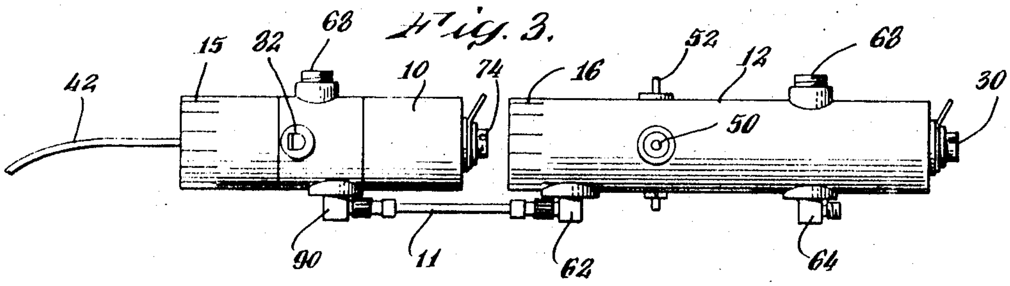
FIGURE 3 is a substantially full size side view of the oscillator and amplifier elements which comprise the transmitter chain of the invention.

In FIGURE 3 the output port 90 of oscillator 10 is shown connected to the input port 62 of amplifier 12 by a coaxial transmission line 11. Also in FIGURE 3 the cylindrical ends 15 and 16 of oscillator 10 and amplifier 12 are shown to be slotted, to facilitate assembly of the internal structure in manufacture, and dissembly for purposes of maintenance, repair and tube replacement, as will be described more fully with reference to FIGURES 4, 5 and 6 of the drawings.

Figures 4, 5, 6, 7, 8:
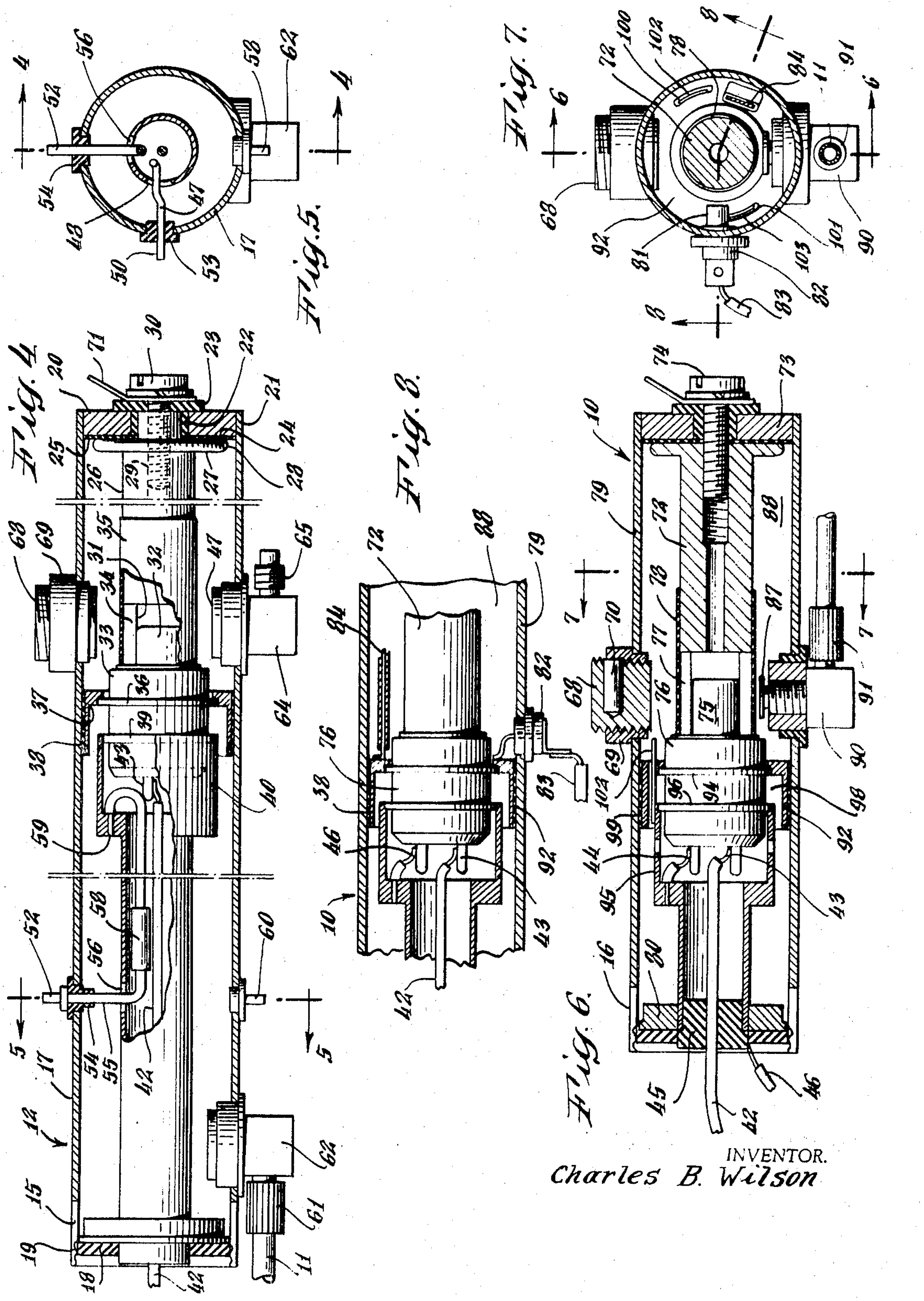
FIGURE 4 is an enlarged horizontal cross-sectional view of the power amplifier unit of the invention.
FIGURE 5 is a lateral cross-sectional view of the power amplifier taken along the line 5—5 of FIGURE 4.
FIGURE 6 is an enlarged horizontal cross sectional view of the oscillator unit of the invention.
FIGURE 7 is a lateral cross-sectional view of the oscillator unit taken along the line 7—7 of FIGURE 6.
FIGURE 8 is a partial horizontal cross-section of the oscillator taken along the line 8—8 of FIGURE 7 to show details of the feedback coupling elements and the connection to the grid sleeve of the triode oscillator.

Referring now to FIGURE 4 of the drawings, the internal construction of the power amplifier unit, indicated generally at 12, will be described in detail. The power amplifier 12 is housed in a cylindrical metal tube 17, preferably of extruded hardened brass having a wall thickness of approximately .032 inch. One end, at the left in FIGURE 4, of the cylinder 17 is provided with a plurality of narrow slots 15, preferably twelve in number, leaving cylindrical segments of resilient metal tubing which may be sprung outward radially from the axis of cylinder 17 to receive an annularly grooved cylindrical end plug 18 which is snap-fitted into corresponding inner annular grooves 19 formed on the inner cylindrical wall at this slotted end of tublar member 17. The opposite end of cylinder 17, at the right in FIGURE 4, is closed by a cylindrical plug 20 which is securely soldered to the wall of cylinder 17 at 21. Through a center hole 22 in the end plug 20 is fitted a flanged insulating bushing 23. The inner plane surface 24 of end plug 20 is covered with a thin sheet of high dielectric insulating material 25, such as mica or Mylar. A cylindrical anode line 26, formed of solid brass, has a radial flange 27 formed on one end thereof with its outer periphery rounded as shown at 28. An axial hole 29 in the flanged end of line 26 is threaded to receive a machine screw 30 which passes through insulated bushing 23 to insulatingly secure anode line 26 to end plug 20. In the opposite end of anode line 26 is machined an axial bore 31 of a diameter to snugly engage the anode terminal 32 of a ceramic triode vacuum tube 33. Radial slots 34 in anode line 26 form a plurality of resilient spring fingers which frictionally engage the anode terminal 32 and facilitate the insertion and removal of tube 33 while assuring firm and continuous electrical contact between anode line 26 and anode terminal 32 when engaged as shown in FIGURE 4. Around the inner end of anode line 26, and covering the slots 34, is placed a sheath 35 of thin, insulating material such as Mylar.

The vacuum tube 33 has an annular grid terminal 36 which is soldered to a cylindrical metallic grid sleeve 37, formed of brass tubing having an outside diameter slightly less than the inside diameter of casing 17. Wrapped around grid sleeve 37, and filling the annular space between it and tubular casing 17, is one or more layers of thin dielectric material 38 which may be Mylar or like insulation. Vacuum tube 33 also has an annular cathode terminal 39 to which is secured a cylindrical cathode sleeve 40, preferably by soldering. The cathode sleeve 40 is mounted on one end of a hollow metallic tube 41, the opposite end of which is coaxially secured to an insulating plug 45 in end plate 18. The insulating plug 45, as shown in FIGURE 6, allows passage therethrough of an insulated heater conductor 42, the other end of which is soldered to one of the vacuum tube heater terminals as shown at 43 in FIGURE 6. The other heater terminal 46 is soldered to a second insulated conductor 47, and is brought out through a hole 48 in the cathode cylindrical line 41, as shown in FIGURE 5, to an external heater terminal 50 mounted through an insulated bushing 53 on the casing wall 17 as shown in FIGURE 5.

An external cathode connection is provided by terminal 52 mounted on insulating bushing 54 through cylindrical casing wall 17. Terminal 52 is connected via an insulated conductor 55 which passes through a hole 56 in the cylindrical cathode line 41 to a radio frequency choke 58 and thence is soldered to the cathode sleeve at 59 as shown in FIGURE 4. A ground connection terminal 60 is directly mounted on the metallic cylinder wall 17 as shown in FIGURE 4. A coaxial connector 61 connects coaxial line 11, from the radio frequency oscillator unit 10, to input port 62 of the power amplifier unit 12. An output port 64 having a coaxial connector 65 conducts amplified radio frequency power from the anode cavity 66 by means of a capacitive coupling 67 as shown in FIGURE 4. A tuning screw plunger 68 is mounted in a threaded bushing 69 mounted on cylinder wall 17 and protrudes into the anode cavity 66, in proximity to anode line 26, as shown in FIGURE 4, for tuning the resonance of cavity 66 to the required output frequency. As shown in cross-section in FIGURE 6, tuning screw 68 carries a compressible insert 70 of nylon or like material to effectively lock the plunger 68 at any position to which it is adjusted, thereby preventing detuning the resonance of cavity 66 through vibrations or shock forces to which the transmitter may be subjected. A source of 1,000 volts direct current is applied to anode line 26 through connector terminal 71, bias potential is applied to cathode connector 52, and heater current is supplied through conductor 42 and terminal 50, to complete the electrical connections necessary for operation of power amplifier unit 12.

The construction of the microwave radio frequency oscillator unit, generally indicated at 10, will now be described with reference to FIGURES 6, 7 and 8 of the drawings. The anode assembly of the oscillator 10 is identical with that described above for the amplifier shown in FIGURE 4, comprising a flanged anode line 72 which corresponds in all respects to anode line 26, insulatingly mounted on end plate 73 by machine screw 74 as shown in FIGURE 6, and in electrically conductive engagement with anode terminal 75 of a triode oscillator vacuum tube 76 through spring fingers 77 which are covered by insulating sheath 78. The physical dimensions of anode line 72 and anode cavity 88 in FIGURE 6 are identical with those of line 26 and cavity 66 in FIGURE 4, and the oscillator cylindrical casing 79 is formed of the same diameter hardened brass tubing as is casing 17 of amplifier 12 in FIGURE 4. The anode cavity 88 of oscillator 10 is tuned to the same resonant frequency as amplifier cavity 66 through an identical tuning screw 68 mounted on the oscillator casing wall 79 in the same position and identical manner as described above with reference to FIGURE 4. Radio frequency energy is taken from oscillator 10 through an adjustable capacitive probe 87, output port 90 and coaxial connector 91 to coaxial cable 11 which is connected with the amplifier input port as described above.

The grid sleeve 92 of oscillator 10 is soldered to the grid ring 94 of vauum tube 76 and is identical in all respects to the grid sleeve construction of the amplifier as described in reference to FIGURE 4, except that two annular slots have been pierced through the front wall of the oscillator grid sleeve annular mounting as shown at 100 and 101 in FIGURE 7. These slots are to permit passage of a pair of feedback rods 102 and 103 which are mounted onto the cathode sleeve 95 of the oscillator shown in FIGURE 6. The cathode sleeve 95 is secured to the cathode ring 96 of vacuum tube 76 in the same manner as described above with reference to FIGURE 4. The rods 101 and 103, which are made of one-sixteenth inch diameter brass, provide the required feedback coupling between anode cavity 88 and the grid-cathode cavity 98 to establish and maintain radio frequency oscillations. The oscillator grid sleeve 92 is insulated from the cylinder wall 79 by a layer of high dielectric material 99. Heater conductor 42 is soldered at 43 to one of the heater terminals of oscillator tube 76 and is brought out through insulating plug 45. The other heater terminal is connected by a short conductor 44 to the cathode sleeve 95 to which external heater conductor 46 is soldered.

Referring now to FIGURES 7 and 8, a connection is made to the grid sleeve 92 by a Phosphor bronze spring member 81 which passes through an insulated bushing 82 in cylinder wall 79 to connect with an external grid pulse line 83. Also as shown in FIGURES 7 and 8 a bimetallic element 84 is secured to the grid sleeve 92 and extends into the anode cavity 88 in the space between anode line 72 and cylinder wall 79 for the purpose of automatically compensating the cavity tuning for changes in temperature. As ambient temperature varies, the bimetallic element 84 bends toward or away from the anode line 72 thereby varying the inter element capacity and maintaining the frequency constant. A similar bimetallic element (not shown) is also mounted on the grid sleeve 37 of power amplifier 12 for the same purpose.

To disassemble the oscillator or amplifier units for replacement of tubes it is only necessary to flare the segmented ends 15 and 16 with a suitable tool and pull out the grooved end plug to which the cathode line is secured. The anode terminal of the tube then disengages from the spring fingers of the anode line and the remaining assembly easily slides out of the cylindrical casing. To reassemble the devices it is only necessary to insert the tube and its associated grid and cathode sleeves into the open end of the cylinder and push until the annular end plug snaps into the annular groove of the cylinder casing.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention which, as a matter of language, might be said to fall therebetween.

Having described my invention, what I claim as new and desire to secure by Letters Patent is:

1. A microwave radio transmitter comprising in combination,
(A) an elongated coaxial tuned cavity triode oscillator having tuned anode, and cathode cavities therein,
(B) feedback means comprising a plurality of rods extending from said cathode and into said anode cavity to initiate and sustain electromagnetic oscillations therein,
(C) means for applying a succession of electrical pulses to the grid of said oscillator triode,
(D) a coaxial tuned cavity triode amplifier having tuned anode, and cathode cavities therein,
(E) means for conducting microwave oscillatory energy from the anode cavity of said oscillator into the cathode cavity of said amplifier,
(F) inductive means in the cathode circuit of said amplifier to retard the rise and fall time of microwave pulses amplified thereby,
(G) a microwave energy output port in the anode cavity of said amplifier, and
(H) a metallic container mounting and substantially enclosing both said oscillator and amplifier therein in heat dissipating relation therewith.

2. The combination of claim 1 including,
(F) a radio frequency choke in said amplifier cathode circuit, and
(I) a bimetallic temperature compensating tuning element mounted on the grid terminal of said oscillator triode and extending into the anode cavity thereof.

3. The combination of claim 1 wherein the anode cavities of said oscillator and amplifier are substantially identical.

4. The combination of claim 1 wherein both said oscillator and amplifier are operated in the quarterwave mode.

5. In a microwave radio transmitter, an oscillator comprising in combination,
(A) a triode vacuum tube having annular cathode and grid terminals and a coaxial anode terminal,
(B) a cylindrical metallic cathode sleeve joined at one end to said annular cathode terminal and supported at its opposite end by a coaxial disc member,
(C) a cylindrical metallic grid sleeve of greater diameter than said cathode sleeve, joined at one end to said annular grid terminal and having its opposite open end overlying a portion of said cathode sleeve in spaced relation therefrom to form an annular cavity therebetween,
(D) an elongated tubular metal cylinder of slightly greater diameter than said grid sleeve and encircling said vacuum tube, cathode sleeve and grid sleeve,
(E) a thin sheath of dielectric insulating material surrounding said grid sleeve and supporting the same coaxially within said elongated metal cylinder,
(F) an annular groove formed in the inner wall of said elongated cylinder at one end thereof for engaging said cathode sleeve disc member,
(G) a coaxial metallic cylinder forming an anode line within said elongated cylinder and insulatingly secured to the closed end of said outer cylinder opposite said grooved end, forming an anode cavity between said anode line and said outer cylinder,
(1) a plurality of radial slots in the unsecured end of said anode line for frictionally engaging said coaxial anode terminal of said vacuum tube,
(2) a sheath of dielectric insulating material surrounding the slotted end of said anode line,
(H) a screw plug threadably mounted on said outer cylinder and extending into said anode cavity,
(I) a plurality of thin metallic rods mounted on said cathode sleeve and extending through apertures in said grid sleeve support and into said anode cavity for conducting a portion of energy from said anode cavity into said cathode cavity to sustain electromagnetic oscillations,
(J) an electrical spring contact engaging said grid sleeve and insulatingly mounted through said outer cylinder wall, and
(K) a capacitive probe insulatingly mounted on said outer cylinder wall and protruding into said anode cavity.

6. In a microwave radio transmitter, a power amplifier comprising,
(A) a triode vacuum tube having annular cathode and grid terminals and a coaxial anode terminal,
(B) a cylindrical metallic cathode sleeve joined at one end to said annular cathode terminal and supported at its opposite end by a coaxial disc member,
(C) a cylindrical metallic grid sleeve of greater diameter than said cathode sleeve, joined at one end to said annular grid terminal and having its opposite open end overlying a portion of said cathode sleeve in spaced relation therefrom to form an annular cavity therebetween,
(D) an elongated tubular metal cylinder of slightly greater diameter than said grid sleeve and encircling said vacuum tube, cathode sleeve and grid sleeve,
(E) a thin sheath of dielectric insulating material surrounding said grid sleeve and supporting the same coaxially within said elongated metal cylinder,
(F) an annular groove formed in the inner wall of said elongated cylinder at one end thereof for engaging said cathode sleeve disc member,
(G) a coaxial metallic cylinder forming an anode line within said elongated cylinder and insulatingly secured to the closed end of said outer cylinder opposite said annularly grooved end, forming an anode cavity between said anode line and said outer cylinder,
(1) a plurality of radial slots in the unsecured end of said anode line for frictionally engaging said coaxial anode terminal of said vacuum tube,
(2) a sheath of dielectric insulating material surrounding the slotted end of said anode line,
(H) a screw plug threadably mounted on said outer cylinder and extending into said anode cavity,
(I) a capacitive probe insulatingly mounted on said outer cylinder wall and protruding into said anode cavity, (J) means including an inductance connected between said cathode sleeve and an external terminal insulatingly mounted on said outer cylinder wall, and (K) means for introducing microwave energy into said grid-cathode cavity.

References Cited

UNITED STATES PATENTS

| | | | |
|---|---|---|---|
| 2,089,781 | 8/1937 | Buschbeuk | 325—170 |
| 2,145,225 | 1/1939 | Kolster et al. | 325—125 |
| 2,232,559 | 2/1941 | Rice | 325—121 |

ROBERT L. GRIFFIN, Primary Examiner

A. J. MAYER, Assistant Examiner

U.S. Cl. X.R.

325—120, 125, 127, 164, 170; 330—56; 331—97, 101